(12) United States Patent
Godet et al.

(10) Patent No.: US 8,698,107 B2
(45) Date of Patent: Apr. 15, 2014

(54) TECHNIQUE AND APPARATUS FOR MONITORING ION MASS, ENERGY, AND ANGLE IN PROCESSING SYSTEMS

(75) Inventors: Ludovic Godet, Boston, MA (US); Christopher J. Leavitt, Gloucester, MA (US); Bon-Woong Koo, Andover, MA (US); Anthony Renau, West Newbury, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 127 days.

(21) Appl. No.: 12/987,950

(22) Filed: Jan. 10, 2011

(65) Prior Publication Data
US 2012/0175518 A1    Jul. 12, 2012

(51) Int. Cl.
*H01J 37/30*    (2006.01)

(52) U.S. Cl.
USPC ................... 250/492.21; 250/287

(58) Field of Classification Search
USPC .................. 250/281, 282, 287, 492.21
See application file for complete search history.

(56) References Cited

U.S. PATENT DOCUMENTS

| | | | |
|---|---|---|---|
| 5,198,666 A * | 3/1993 | Bateman | 250/294 |
| 5,654,544 A * | 8/1997 | Dresch | 250/287 |
| 5,661,298 A * | 8/1997 | Bateman | 250/281 |
| 5,734,162 A * | 3/1998 | Dowell | 250/292 |
| 5,847,385 A * | 12/1998 | Dresch | 250/287 |
| 5,883,005 A * | 3/1999 | Minton et al. | 250/251 |
| 6,008,491 A | 12/1999 | Smentkowski et al. | |
| 6,992,310 B1 * | 1/2006 | Ferrara et al. | 250/492.21 |
| 7,586,110 B1 * | 9/2009 | Low | 250/492.21 |
| 2001/0039098 A1 * | 11/2001 | Lu | 438/407 |
| 2005/0191409 A1 * | 9/2005 | Murrell et al. | 427/8 |
| 2007/0145298 A1 * | 6/2007 | Freer et al. | 250/492.21 |
| 2007/0187585 A1 * | 8/2007 | Verentchikov | 250/287 |
| 2007/0210248 A1 | 9/2007 | Koo et al. | |
| 2009/0189072 A1 * | 7/2009 | Egan et al. | 250/287 |

OTHER PUBLICATIONS

Van Ingen, R.P., Angle-resolved time-of-flight spectrometry of neutrals laser ablated from Nd1.85Ce0.15CuO4,Journal of applied Physics, Dec. 15, 1994, pp. 8065-8076, vol. 76, No. 12, American Institute of Physics.

* cited by examiner

*Primary Examiner* — Phillip A Johnston
*Assistant Examiner* — Brooke Purinton

(57) ABSTRACT

A time-of-flight (TOF) ion sensor system for monitoring an angular distribution of ion species having an ion energy and incident on a substrate includes a drift tube wherein the ion sensor system is configured to vary an angle of the drift tube with respect to a plane of the substrate. The drift tube may have a first end configured to receive a pulse of ions from the ion species wherein heavier ions and lighter ions of the pulse of ions arrive in packets at a second end of the drift tube. An ion detector may be disposed at the second end of the ion sensor, wherein the ion detector is configured to detect the packets of ions derived from the pulse of ions and corresponding to respective different ion masses.

14 Claims, 5 Drawing Sheets

US 8,698,107 B2

TECHNIQUE AND APPARATUS FOR MONITORING ION MASS, ENERGY, AND ANGLE IN PROCESSING SYSTEMS

FIELD

This invention relates to the implantation of workpieces and, more particularly, to a method and apparatus for monitoring ion implantation.

BACKGROUND

Plasma processes are widely used in semiconductor manufacturing, for example, to implant wafers with various dopants, or to deposit or to etch thin films. During a plasma ion implantation process such as plasma doping processes (PLAD), ions are extracted through a high voltage sheath and accelerated toward a target.

In a typical PLAD process, a plasma may be monitored by measuring an implant dose based on a Faraday cup current. However, a Faraday cup is limited to measuring total charge, which does not distinguish between different charged particles or otherwise offer any insight into the plasma. In addition, in pulsed plasma processing wherein a plasma alternates between on and off states, time-resolved measurements of the plasma are often required.

To address some of the above concerns, a time-of-flight ion sensor technique for monitoring ions in a plasma has been developed. In particular, U.S. Pat. No. 7,476,849, issued Jan. 13, 2009, and incorporated by reference herein in its entirety, discloses the use of a time-of-flight sensor to monitor at a fixed angle the plasma species including ions that may impinge on a substrate.

Another method of implanting wafers with various dopants is through the use of ion implantation using a beamline tool. For example, in conventional beamline tools (as well as newly developed ion beam systems based upon plasmas) ions may impinge on a workpiece over a wide range of angles. FIG. 1 is a cross-sectional view of a known focusing plate arrangement for implanting ions having a wide angular distribution on a substrate. The focusing plate 11 is configured to modify an electric field within the plasma sheath 242 to control a shape of a boundary 241 between plasma 14 and the plasma sheath 242. Accordingly, ions 102 that are attracted from the plasma 14 across the plasma sheath 242 may implant into the workpiece 10 at a large range of incident angles (see, e.g., ion trajectories 269-271).

In addition to sampling ion species, it may be desirable to measure the angular distribution of ions in such ion beam systems. For example, the exact distribution of ion angles, energies, and mass may be critical in determining the resulting properties of devices formed by such a process. However, none of the aforementioned techniques provide information regarding the mass, ion energy, and angular distribution of ion species.

In view of the above, it will be apparent that in order to achieve predictable and repeatable process results for ion implantation, there is a need to closely monitor and control ion parameters, such as ion energy, angular distribution, and mass.

SUMMARY

In one embodiment, a time-of-flight (TOF) ion sensor system for monitoring an angular distribution of ion species incident on a substrate and having ion energy, comprises a drift tube having a first end configured to receive a pulse of ions from the ion species wherein heavier ions and lighter ions of the pulse of ions arrive in packets at a second end of the drift tube, said ion sensor system configured to vary an angle of the drift tube with respect to a plane of the substrate. The ion sensor system may also include an ion detector disposed at the second end of the ion sensor, wherein the ion detector is configured to detect the packets of ions derived from the pulse of ions and corresponding to respective different ion masses.

In another embodiment, a method of measuring ion species incident upon a substrate plane received from a plasma comprises applying a first potential between the plasma and a time-of-flight (TOF) sensor that includes a drift tube and detector, wherein the ion species are attracted to the TOF sensor at a designated ion energy; and performing a first angular scan. The first angular scan includes positioning the TOF sensor in a substrate region at a first angle with respect to the substrate plane and detecting an ion mass of the ion species at the first angle. The first angular scan also includes positioning the time-of-flight sensor at one or more additional angles with respect to the substrate plane and detecting an ion mass of the ion species at the one or more additional angles.

BRIEF DESCRIPTION OF THE DRAWINGS

For a better understanding of the present disclosure, reference is made to the accompanying drawings, which are incorporated herein by reference and in which.

DETAILED DESCRIPTION

Embodiments of the invention disclosed herein provide improved processing systems and in particular improved time-of-flight (TOF) ion sensor systems that are suitable for in-situ monitoring and controlling of ion beam and plasma processes, including those that provide ions incident on a substrate over a range of angles. In general, ion energy, mass, and angular distribution may be measured according to the TOF sensor arrangements of the present invention. Each TOF ion sensor may be installed in a variety of ways in a process chamber and may be configured for a number of functions such as, for example, in-situ process control, process readiness verification, fault detection, implant dose correction, and implant uniformity measurement. In particular, the ion mass, energy, and angular distribution may be measured in real time when a substrate is exposed to ions from the plasma, thereby providing a monitoring tool that may be used to develop an implantation profile of a substrate, and/or to adjust plasma parameters in real time to modify the implant profile, among other advantages.

Figure 2A:
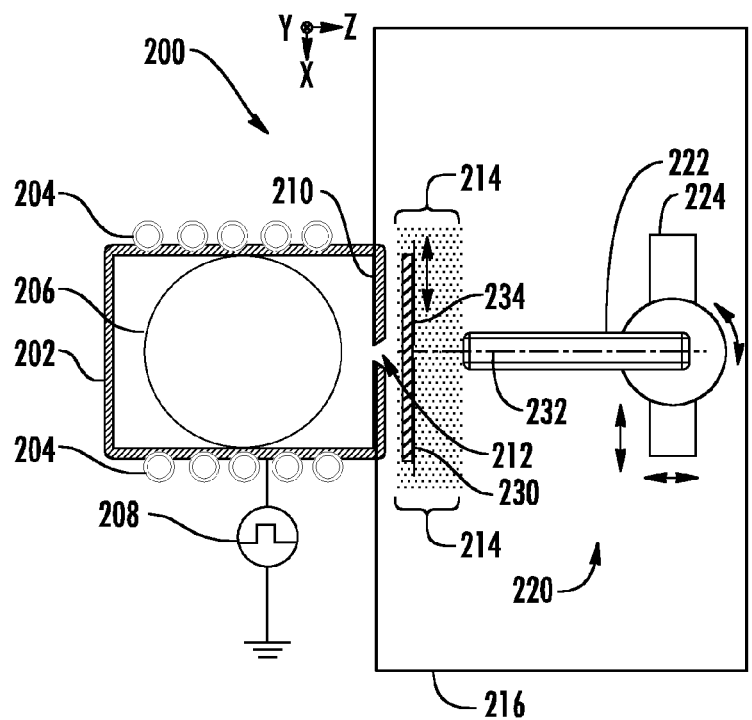
FIGS. 2a and 2b are schematics of a processing system including an exemplary TOF system.

FIG. 2a is a schematic depiction of elements of an exemplary ion processing system (or "processing system") 200 that includes a TOF sensor system, according to an embodiment of this disclosure. Processing system 200 includes a plasma chamber 202 that contains plasma 206. Coils 204 may be used to create the plasma using RF-induction or may be created by other known methods. In addition, plasma 206 may be created as a continuous or pulsed plasma according to known methods.

Figure 1:
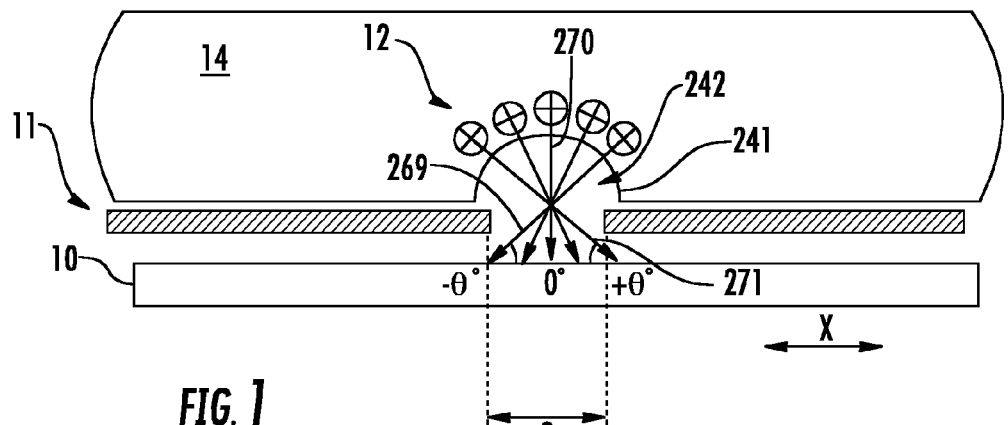
FIG. 1 is a cross-sectional view of a known processing arrangement.

Ion processing system 200 may be used to provide ions to a substrate holder 230 for processing a substrate 234. Such processing may include ion implantation of the substrate or treating patterned surface features such as photoresist structures, among other purposes. A bias may be applied between the plasma and substrate holder in order to cause ions in the plasma to travel towards substrate holder 230 at a desired energy. In one example, a pulsed positive DC-bias 208 may be supplied to plasma 206, which may serve to accelerate positive ions in the plasma 206 towards substrate holder 230, which may be at ground potential. Ions that exit the plasma boundary (see element 241 in FIG. 1) and impinge on substrate holder 230 may form a range of angles of incidence. In the embodiment depicted in FIG. 2, a plate 210 is positioned on one side of the plasma chamber 202, which may provide an ion beam that is extracted through aperture 212 and exhibits a range of ion incidence angles.

Plate (or plasma sheath modifier) 210 may be configured similarly to plate 11 (shown in FIG. 1) in that a plasma sheath shape is modified wherein ions exit the plasma chamber 202 over a range of angles. When ions from plasma 206 impinge on substrate holder 230 their kinetic energy may be determined to a first order by the potential difference between the plasma boundary (241 in FIG. 1) and substrate 230, particularly in the case where a collisionless sheath exists between plasma 206 and workpiece 234. However, it is known that the transfer of energy, momentum, and the implantation range of ions into the substrate, among other processes, may vary substantially among different ions that have the same kinetic energy but have a different angle of incidence toward a substrate.

Processing system 200 also contains a TOF system 220 that may be used to probe ion species, ion energy, and angular distribution for ions extracted from plasma 206. Moreover, system 200 may provide process monitoring capability, ability to measure ion profile as process parameters are tuned, and ion dose monitoring, among other things.

In accordance with embodiments of this disclosure, system 200 may operate in a variety of modes. In a first mode, system 200 may operate as a "production" tool to provide ions to a workpiece or set of workpieces according to a desired recipe, or set of operating parameters. In this production mode, TOF sensor system 220 does not monitor ions and may be positioned such that it is not exposed to the ions, as depicted in FIG. 2a. Ions extracted from the plasma chamber 202 may enter process chamber 216 and traverse a substrate region 214 of the chamber 216, in which a substrate holder 230 is typically positioned during the production mode. The ions then impinge upon a substrate 234 and may implant therein according to design. In production mode, the substrate holder 230 may be scanned along the x-direction, for example, to expose an entire substrate 234 to ion bombardment from ions exiting plasma 206 through aperture 212.

Figure 2B:
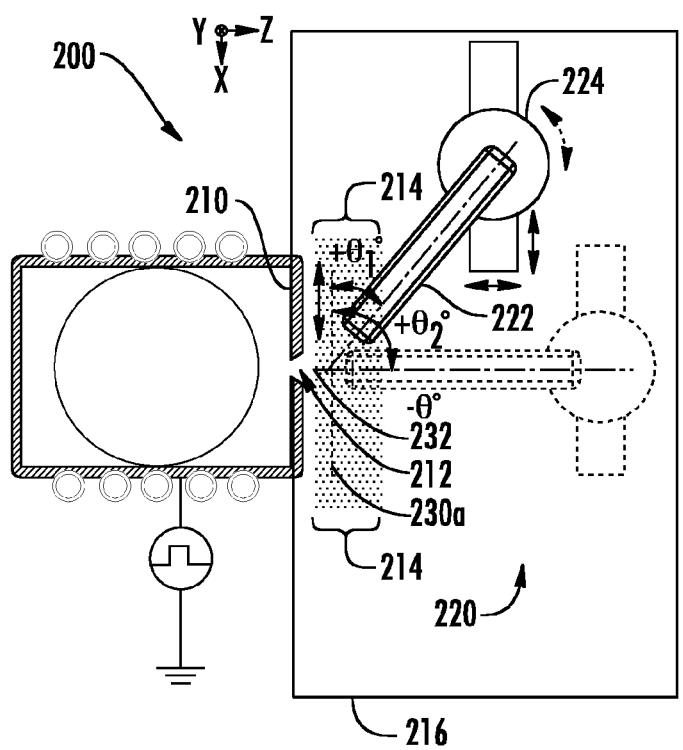

In a replacement mode, depicted in FIG. 2b, TOF sensor system 220 may be deployed within the substrate region 214, to collect ions in a similar environment as that experienced by the substrate in production mode, while substrate holder 230 is removed from its usual position(s) 230a used in production mode to allow for more convenient ion measurements.

In a monitoring mode, both substrate holder 230 and TOF sensor system 220 may be simultaneously exposed to ions extracted from plasma 206, wherein "production" substrates may be implanted and ions collected and analyzed by the TOF sensor at the same time that ion implantation is taking place in the substrate.

An end of sensor 222 that receives ions may be disposed within substrate region 214 and be proximate or at a plane of workpiece 230 that may represent the plane of workpiece 230 used in production mode. Positioning the sensor 222 in this manner may help to accurately measure the ion profile that is experienced by the workpiece in production mode. In a monitoring mode, both substrate holder 230 and TOF sensor system 220 may be disposed in a position to receive ions extracted from plasma 206. For example, substrate holder 230 may be configured with an aperture in a middle portion that may be aligned with aperture 212 to provide ions to TOF system 220. However, other monitoring mode configurations are possible, such as positioning TOF sensor 222 between substrate holder 230 and plate 210.

In the example of FIGS. 2a, 2b, TOF system 220 includes TOF sensor 222 and TOF sensor positioner (or holder) 224 that may provide a rotational motion and a translational motion in an x- and z-directions, and may also provide motion in a y-direction (coming out of the page). However, other mechanisms are possible for positioning TOF sensor 222. As used herein the terms "TOF sensor," "TOF ions sensor," and "ion sensor" may be used interchangeably and refer to a device that may contain an extraction electrode, a TOF drift tube and ion detector, among other components. TOF sensor holder 224 may itself be attached to or form a part of chamber 216. In one example, TOF sensor holder may be configured to attach to a holder or stage, such as substrate holder 230, or, in another example, may be attached to and controllable by a mechanism located outside chamber 216.

Figure 3:
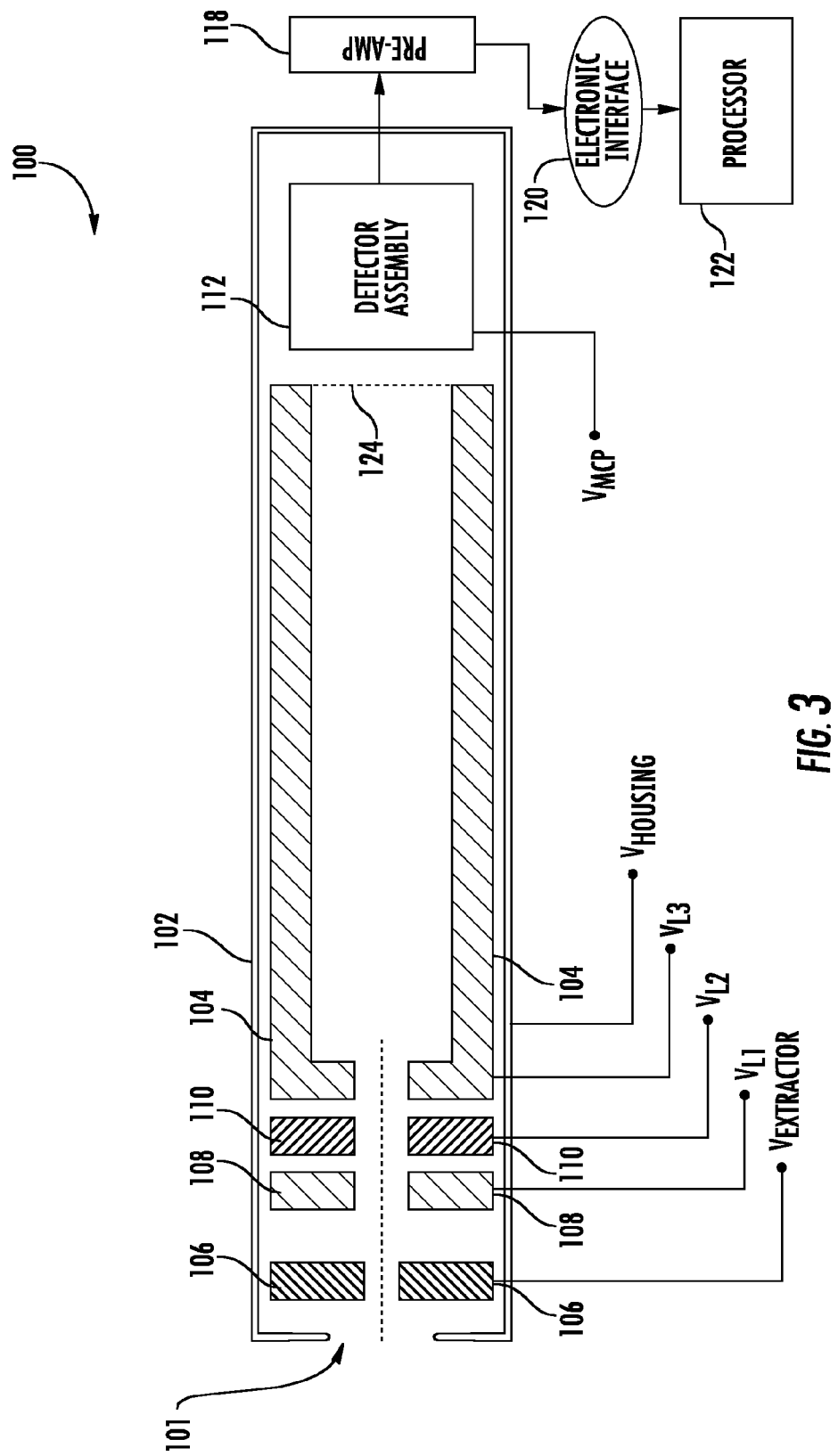
FIG. 3 is a schematic of an exemplary TOF sensor.

In accordance with embodiments of the present disclosure, TOF system 220 may provide the capability of measuring ion species and ion energy as a function of angle of incidence. Many components of TOF sensor 222 may be configured according to the configurations disclosed in U.S. Pat. No. 7,476,849. Referring to FIG. 3, there is shown an exemplary ion sensor 100 in accordance with an embodiment of sensor 222. Ion sensor 100 may comprise a housing 102 that may be adapted for installation in another portion of process chamber 216, such as a holder 224. The housing 102 may be individually biased at a desired potential $V_{housing}$. For example, in monitoring or replacement mode, $V_{housing}$ may be set to equal the potential applied to holder 230 in production or monitoring mode, such that ions from plasma 206 are attracted to sensor 222 similarly to the manner in which ions impinge on a substrate 230.

Ion sensor 100 may also comprise a drift tube 104 inside the housing 102 which may also be individually biased, for example, at a desired potential $V_{L3}$.

In some embodiments, a pressure surrounding ion sensor 100 may be similar to a plasma chamber's pressure, typically 1-3000 mTorr, while the drift tube is typically operated at $2 \times 10^{-6}$ Torr or less. Therefore, differential pumping may be provided to accommodate the pressure difference. However, in other embodiments, the pressure surrounding ion sensor 100 may be on the order of $10^{-6}$ Torr or less, requiring no differential pumping.

Sensor 100 may include an extractor electrode 106 biased at a suitable potential $V_{extractor}$ to attract either positive or negative ions from a plasma, as well as additional lenses 108 and 110, which may be biased at $V_{L1}$ and lens 110 at $V_{L2}$, respectively The drift tube 104, biased at $V_{L3}$, may function as a third electrostatic lens in the series. Sensor 100 may be arranged to admit ions in pulses to drift tube 104, for performing time-of-flight measurements of the ions using detector assembly 112.

Figure 4:
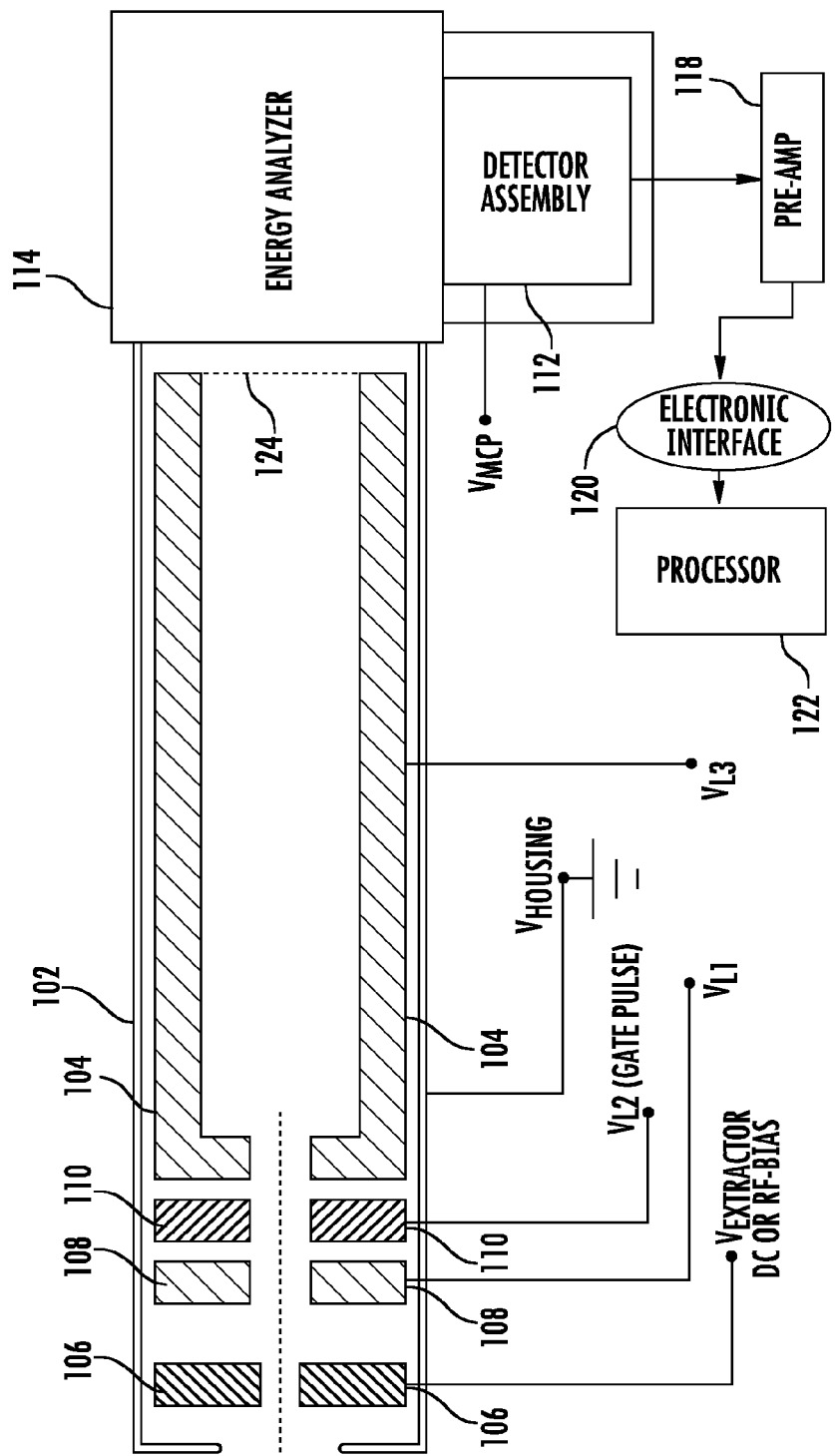
FIG. 4 is a schematic of a further exemplary TOF sensor.

In some embodiments of an ion sensor, an energy analyzer 114 may be provided, as depicted in FIG. 4. One of the electrodes 106-110 may act as a gate, such that when the gate is opened and ions are attracted to drift tube 104, the ions may drift into the opposite end of drift tube 104 and into energy analyzer 114. Energy analyzer 114 may be a known analyzer whose function is to deflect ions toward detector 112 according to a designated ion energy. Accordingly, only ions of the designated energy are deflected to detector 112.

Thus, after a single gate pulse, detector 112 may detect a series of groups of ions that arrive at detector 112 at different times according to the ion mass, all of which have the ion energy as determined by energy analyzer 114. A series of measurement may be performed by pulsing the gate and collecting groups of ions at detector 112 after each pulse. According to one embodiment, electrode 110 (i.e., gate electrode) may be normally biased with a positive voltage similar to the plasma potential, except during the very short gating period. For example, a gate pulse width may be about 100 ns.

In a plasma monitoring mode or replacement mode, sensor 100 may be configured to open the gate only near or during periods in which ions are accelerated from a plasma, such as plasma 206. For example, DC positive voltage pulses 208 may be applied to plasma 206, wherein workpiece 230 (as well as sensor 100), which may be grounded, acquires a negative potential with respect to plasma 206, which may be for example between −10V and −50 kV. Ions are accelerated from the plasma boundary (241 from FIG. 1) and may exit aperture 212, after which the ions may impinge on sensor 100 and workpiece 234 (if workpiece 234 is in place at the time) with an energy determined by the applied DC plasma potential. In some embodiments, gate pulsing to sample ions in the ion sensor may take place only for a small fraction of time, for example, by applying a 100 ns gate pulse for each DC pulse of plasma 206, which may take place every 200 μs.

In other embodiments, time-resolved measurements may be performed by providing a series of ion sensor gate pulses at various points before, during and/or after the DC pulse is applied. For a DC pulse that lasts on the order of a tenth of a millisecond, many TOF measurements for 100 ns gate pulses may be applied during a single DC plasma pulse as desired.

Referring again to FIG. 2b, in order to provide information that accurately measures the ion distribution experienced by a workpiece for a given set of operating conditions of system 200, sensor system 220 may be rotated through a series of angles (see, for example, $\theta_1$ and $\theta_2$) with respect to a plane of substrate 230, while one or more TOF measurements are performed at each angle. In addition, the position of TOF sensor along the x-direction may be varied and TOF measurements performed as a function of position. For example, referring also to FIG. 1, system 200 may include an extraction plate similar to extraction plate 11 that is used to provide ions to a workpiece. Holder 224 may be indexed to align sensor 220, which may be embodied as sensor 100, with the center of the aperture in plate 11, as suggested by FIG. 2. In one example, the aperture is a slit whose width G along the x-direction helps define the width and angular spread of ions on a substrate plane underneath the apertures. Accordingly, a series of TOF measurements at different orientation angles θ may be performed while the extractor side of sensor 100 is near the center 232 of the aperture. In one example, the electrode system of the TOF sensor may provide an acceptance angle of ions on the order of 1 degree or so. It may therefore be convenient to provide a rotation of sensor 100 of at least one degree between each measurement or set of measurements. After performing a series of TOF measurements at discrete angles through a desired angular range, holder 224 may then be scanned with respect to the narrow dimension of the aperture, that is, holder 224 may be moved in a +x or −x direction, after which a further series of measurements through an angular range may be performed.

Accordingly, an exemplary TOF sensor system, such as system 220, may produce a set of TOF mass spectra that represent the spectra of mass species collected over a set of different angles. Information in the spectra set may include the variation in relative amounts of different ion species (that is, different masses) as a function of angle of incidence.

Additionally, an energy analyzer, such as energy analyzer 114 may be used to collect one or more TOF spectra at one or more ion energies for any desired angle of ion incidence. Because the velocity and therefore time-of-flight of ions in a drift tube is dependent on both ion mass and energy, a detected signal may conflate both ion mass and energy if ions enter the drift tube with a spread of energies and are passed directly to a detector without energy analysis. Accordingly, energy analyzer 114 may be set for a given measurement to deflect only those ions of a designated energy to detector 112. In this manner, since the energy of detected ions is fixed for a given measurement, all ions of a given mass should arrive at the detector at the same time, thereby ensuring that each peak in a TOF spectrum has a unique mass (or rather mass/charge ratio).

In one example, a 10 keV potential may be applied between the plasma chamber 202 and substrate 230, while a series of TOF measurements is performed at a fixed angle using different ion energy settings for energy analyzer 114. The energy of energy analyzer 114 may be initially set at 10 keV to record ions having the nominal ion energy to be investigated. The energy analyzer could subsequently be set to other energies near 10 keV, which may provide useful information concerning the spread of ion energies and ion masses for the given nominal ion energy. Thus, embodiments of the present disclosure may provide a multi-dimensional parameter analysis of energetic ions incident on a substrate, including ion species, energy, and angular of incidence.

Embodiments also enhance the ability to monitor high energy ion processes in a compact environment that may exist in an actual production system. In order to provide a rotatable a TOF sensor that can be conveniently positioned and rotated with a process chamber, it may be desirable to configure the TOF sensor with a relatively short length, thereby requiring a short drift tube design. However, when pulses of ions are admitted toward a drift tube with high ion energies, such as 10 keV or higher, the pulse of ions may arrive at a detector such that ions of different masses are so closely spaced that they cannot be resolved adequately into separate signals or peaks by a detection system. This is because all the high energy ions within a pulse may enter the drift tube with very high velocities in accordance with the ion energy, such that the time-of-flight in the field free region is so short that the difference in time-of-flight duration for ions of differing masses that is too small to resolve in a counter used to detect ions.

In accordance with embodiments of the present disclosure, at least one electrode in a TOF sensor is operable to receive a deceleration potential to counteract the energy of incident ions that enter the TOF sensor before the ions enter the drift tube portion. The magnitude of the deceleration potential may be chosen to reduce the energy of incident ions to a desired level before the ions enter the field-free region whose length dictates the time-of-flight for each ion mass. This may facilitate better mass resolution for TOF measurements of incident ions. Referring to FIG. 3, a bias may be applied to components of sensor 100 such as electrodes 108, 110, drift tube 104, and detector assembly 112, in order to reduce the ion energy to a level in which a desired mass resolution can be achieved by sensor 100.

In one example, a +25 kV retarding potential may be applied to various components of sensor 100 to decelerate positive ions having 30 keV energy. In one example, electrode 106 may act as a gate electrode, as described above, such that, when the gate is open, 30 keV ions are admitted towards drift tube 104. The ions may then be decelerated by +25 keV potential applied to electrodes 108, 110, 104, such that a decelerated pulse of ~5 keV ions may then enter drift tube 104. The time-of-flight difference among 5 keV ions having different mass may then be sufficient for a detector to detect as separate packets thereby producing separate peaks in a mass spectrum.

In one embodiment, the sensor 100 may be operated using a deceleration potential applied to an electrode when the incident ion energy is within a designated range, for example, above 10 keV, while no deceleration potential is applied for ions having lower incident energy. For example, for low energy positive ions, such as 2 keV ions, electrode 108 may be biased at +2 keV under a closed gate mode, and pulsed to −1 keV under an open gate to accelerate ions toward the drift tube, as described above.

In a further embodiment, the TOF sensor, such as sensor 100, may be configured with an RF bias to help protect the TOF sensor from errors that may be introduced due to exposure to ions over time. In one example, extractor electrode 106 may be provided with a radio frequency (RF) (1-300 MHz, typically 13.56 MHz) bias. The RF biased extractor electrode 106 may serve multiple functions—extracting ions and removing deposits from the extractor aperture—in a deposition-dominant environment. Many manufacturing processes are carried out in a deposition-dominant environment wherein thin-film materials, either electrically conductive or insulating, are deposited in a plasma chamber. If a thick insulating film blocks the extractor aperture, a DC bias on the extractor electrode 106 may no longer be effective. An RF bias may help sputter clean the extractor aperture to remove the deposited materials. That is, an RF bias may provide the ion sensor 300 with a "self-cleaning" capability. For ion extraction, the RF bias may have a negative average potential with respect to the plasma potential. For sputter cleaning purposes, the RF self-bias may be larger than a sputtering threshold and the peak-to-peak value may be 100-1000V or higher. The RF-biased electrode can also act as a capacitive probe to provide information regarding deposition thickness according to known techniques. This information can then be used, for example, to adjust operating parameters of sensor 100, such as electrode potentials, so that TOF measurements are not affected by accumulation of material around electrodes.

Figure 5:
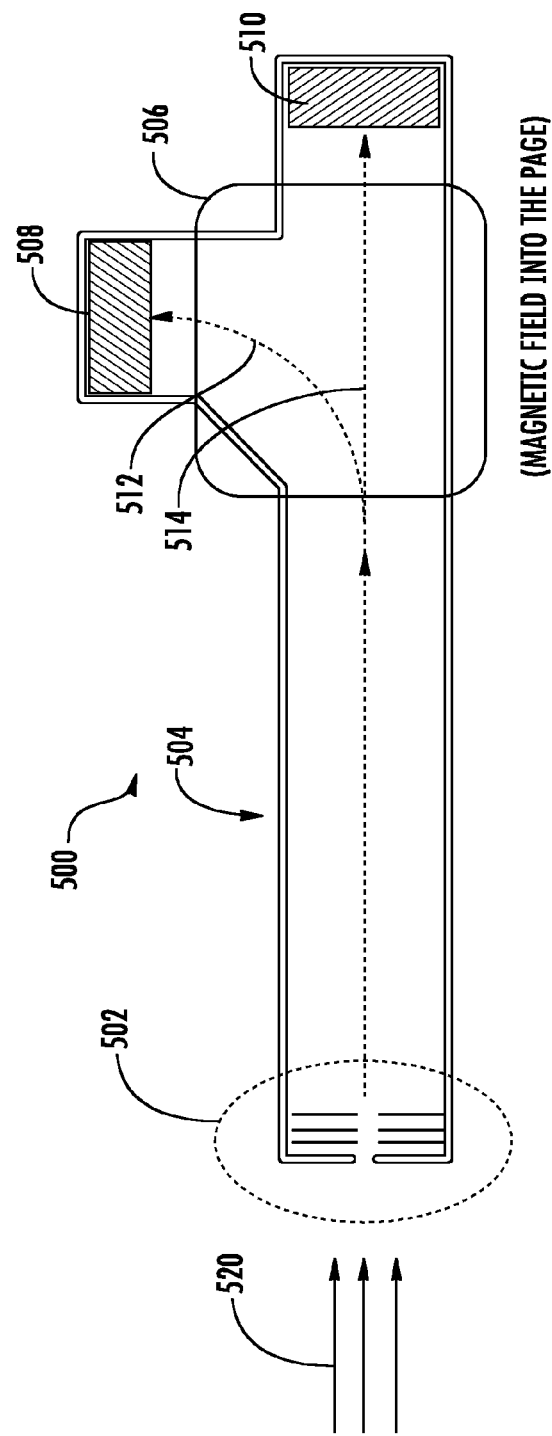
FIG. 5 is a schematic of another exemplary TOF sensor.

FIG. 5 depicts a further embodiment of an ion sensor. Sensor 500 includes aperture set 502, which may extract, gate, and/or decelerate ions as described above with respect to ion sensor 100. Sensor 500 also includes a drift tube 504, energy analyzer 506, and detectors 508 and 510. In some embodiments, sensor 500 may monitor energetic neutrals as well as ions. For example, sensor 500 may be arranged to accept an energetic beam 520. Sensor 500 may be arranged to collect such a beam over a range of angles as described above with respect to sensor system 220. Energetic beam 520 may comprise energetic ions that are accelerated to a desired ion energy and energetic neutrals that result from the ions that are neutralized after extraction and/or deceleration. The energetic neutrals may typically have energies similar to the desired ion energy or less than the desired ion energy. When beam 520 passes through drift tube 504, ions and neutrals may travel together through the drift tube. When ions 512 pass through energy analyzer 506, they may be deflect as shown and be detected by detector 508 disposed in a side portion of the ion sensor 500. The energy analyzer 506 may be a magnetic analyzer for example that creates a B-field to deflect electrically charged species, for example, positive ions, in the direction shown. However, because the energetic neutrals 514 do not carry charge, the energetic neutrals 514 may continue in a straight trajectory as shown, to be detected by "in-line" detector 508. Accordingly, ion sensor 500 may be used to provide information concerning the amount of energetic neutrals and their angular distribution, as well as information regarding energetic ions similar to that provided by the aforementioned embodiments depicted in FIGS. 1-4.

It should be noted that the ion sensor systems in accordance with the present disclosure as described above typically involve the processing of input data and the generation of output data to some extent. This input data processing and output data generation may be implemented in hardware or software. For example, specific electronic components may be employed in an ion beam processing tool or similar or related circuitry for implementing the functions associated with in-situ monitoring of ion species in accordance with the present disclosure as described above. Alternatively, one or more processors operating in accordance with stored instructions may implement the functions associated with in-situ monitoring of ion species in accordance with the present disclosure as described above. If such is the case, it is within the scope of the present disclosure that such instructions may be stored on one or more processor readable carriers (e.g., a magnetic disk), or transmitted to one or more processors via one or more signals.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. For example, although embodiments of the disclosure have been depicted in which an ion beam system employs an extraction plate to form an ion beam, the TOF sensor system of the present invention may be advantageously deployed in many types of apparatus that generate ions including those without such extraction plates. Moreover, the TOF sensor system can operate in a processing system in which only a monitoring mode or only a replacement mode is practical.

Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Thus, the claims set forth below should be construed in view of the full breadth and spirit of the present disclosure as described herein.

What is claimed is:

1. A method of measuring ion species incident upon a substrate plane received from a plasma comprising:
generating the plasma in a plasma chamber, the plasma chamber comprising a plasma sheath modifier and an aperture defined in the plasma sheath modifier, the aperture having a width along a first direction;
applying a first potential between the plasma and a time-of-flight (TOF) sensor, the TOF sensor comprising a drift tube having a first end configured to receive ion species generated in the plasma chamber and a detector disposed at a second end of the drift tube;
attracting the ion species to the detector of the TOF sensor at a designated ion energy;

performing a series of TOF measurements of ions by rotating the drift tube through a first angular range;
moving the TOF sensor along the first direction; and
performing a further series of TOF measurements of ions by rotating the drift tube through a second angular range.

2. The method of claim 1, further comprising:
providing an RF bias voltage to an electrode of the TOF sensor that acts as a capacitive probe;
monitoring a deposition thickness of material accumulated on the electrode; and
adjusting operating parameters of the TOF sensor in accordance with the deposition thickness.

3. The method of claim 1, further comprising:
providing an energy analyzer between the drift tube and the detector; and
setting the energy analyzer to transmit to the detector ions received from the drift tube according to a desired energy.

4. The method of claim 1, wherein the ion species are positive ions, the step of detecting the ion mass further comprising:
providing a pulse of voltage on a first electrode in the TOF sensor that is negative with respect to a plasma voltage; and
recording a time-of-flight of ion species through the drift tube at the detector.

5. The method of claim 4, further comprising providing a deceleration potential on a second electrode that decelerates the ions below the designated energy before the ions enter the drift tube.

6. The method of claim 5, wherein the first electrode comprises a gate electrode that is configured to block ions entering the TOF sensor in a closed mode and is configured to transmit ions toward the drift tube during an open mode corresponding to a duration of the voltage pulse on the first electrode.

7. The method of claim 6, wherein the first potential is applied as a series of DC pulses, wherein the open mode is triggered one or more times during the voltage pulse.

8. An ion implantation system, comprising:
a plasma source configured to generate a plasma at a plasma potential in a plasma chamber, the plasma source comprising a plasma sheath modifier and an aperture defined in the plasma sheath modifier, the aperture having a width in a first direction;
a substrate holder operable to position a substrate in a substrate plane of a substrate region and to receive a substrate potential, wherein the plasma chamber supplies an ion beam into the substrate region containing ions incident over a range of angles at an energy defined by a difference in a potential of the plasma and a potential of the substrate; and
a time-of-flight (TOF) ion sensor system disposed near the substrate holder, said TOF ion sensor system including:
a TOF sensor comprising a drift tube having a first end operable to receive the ions in the substrate region generated by the plasma chamber and configured to receive the substrate potential, the TOF sensor including a detector disposed at a second end of the drift tube; and
a positioner configured to vary an angle of the TOF sensor by rotating the drift tube through a first angular range with respect to the substrate plane in a first series of TOF measurements, move the TOF sensor along the first direction and conduct a second series of TOF measurements of ions by rotating the drift tube through a second angular range.

9. The ion implantation system of claim 8, wherein the plasma sheath modifier is configured to provide ions to the substrate plane over the range of angles.

10. The method of claim 1, wherein the first angular range and the second angular range are the same.

11. The ion implantation system of claim 8, wherein the first angular range and the second angular range are the same.

12. The method of claim 1, wherein the first direction is orthogonal to a second direction, the method further comprising moving the detector in a third direction orthogonal to the first and second directions such that the detector remains at a set position with respect to the first direction.

13. The ion implantation system of claim 8, wherein the first direction is orthogonal to a second direction, and the positioner is further configured to move the detector in a third direction orthogonal to the first and second directions such that the detector remains at a set position with respect to the first direction.

14. A method of measuring ion species incident upon a substrate plane received from a plasma comprising:
generating the plasma in a plasma chamber, the plasma chamber comprising a plasma sheath modifier and an aperture defined in the plasma sheath modifier, the aperture having a width along a first direction;
applying a first potential between the plasma and a time-of-flight (TOF) sensor, the TOF sensor comprising a drift tube extending in a second direction orthogonal to the first direction, a first end configured to receive ion species generated in the plasma chamber and a detector disposed at a second end of the drift tube;
attracting the ion species to the detector of the TOF sensor at a designated ion energy;
performing a series of TOF measurements of ions by rotating the drift tube through a first angular range;
moving the detector in a third direction orthogonal to the first and second directions such that the detector remains at a set position with respect to the first direction;
moving the TOF sensor along the first direction; and
performing a further series of TOF measurements of ions by rotating the drift tube through second angular range.

* * * * *